(12) United States Patent
Lin et al.

(10) Patent No.: US 8,198,739 B2
(45) Date of Patent: Jun. 12, 2012

(54) SEMI-CONDUCTOR CHIP WITH COMPRESSIBLE CONTACT STRUCTURE AND ELECTRONIC PACKAGE UTILIZING SAME

(75) Inventors: How Lin, Vestal, NY (US); Frank Egitto, Binghamton, NY (US); Voya Markovich, Endwell, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 0 days.

(21) Appl. No.: 12/836,612

(22) Filed: Aug. 13, 2010

(65) Prior Publication Data

US 2012/0038046 A1 Feb. 16, 2012

(51) Int. Cl.
*H01L 23/48* (2006.01)
*H01L 21/44* (2006.01)

(52) U.S. Cl. ... 257/786; 257/773; 257/780; 257/E23.02; 257/E21.503; 438/612; 438/618; 438/666

(58) Field of Classification Search .................. 257/786, 257/773, 780, E23.02; 438/612, 618, 666
See application file for complete search history.

(56) References Cited

U.S. PATENT DOCUMENTS

| | | | |
|---|---|---|---|
| 4,845,542 A | 7/1989 | Bezuk et al. | |
| 5,148,265 A | 9/1992 | Khandros et al. | |
| 5,148,266 A | 9/1992 | Khandros et al. | |
| 5,455,390 A | 10/1995 | Distefano et al. | |
| 5,834,844 A * | 11/1998 | Akagawa et al. | 257/734 |
| 5,863,814 A | 1/1999 | Alcoe et al. | |
| 5,915,169 A * | 6/1999 | Heo | 438/118 |
| 6,086,808 A | 7/2000 | Sorensen et al. | |
| 6,104,087 A | 8/2000 | Distefano et al. | |
| 6,150,255 A | 11/2000 | Downes, Jr. et al. | |
| 6,187,615 B1 | 2/2001 | Kim et al. | |
| 6,211,572 B1 | 4/2001 | Fjelstad et al. | |
| 6,232,666 B1 * | 5/2001 | Corisis et al. | 257/774 |
| 6,281,111 B1 | 8/2001 | Ohsumi | |
| 6,291,877 B1 * | 9/2001 | Usami et al. | 257/679 |
| 6,372,527 B1 | 4/2002 | Khandros et al. | |
| 6,521,970 B1 | 2/2003 | Takiar et al. | |
| 6,528,349 B1 | 3/2003 | Patel et al. | |
| 6,642,083 B2 | 11/2003 | Miyazaki et al. | |
| 6,975,037 B2 * | 12/2005 | Farnworth et al. | 257/778 |
| 7,292,055 B2 | 11/2007 | Egitto et al. | |
| 7,455,915 B2 | 11/2008 | Johnson | |
| 7,456,046 B2 | 11/2008 | Buchwalter et al. | |
| 7,511,518 B2 | 3/2009 | Egitto et al. | |
| 7,534,652 B2 | 5/2009 | Haba et al. | |
| 7,618,844 B2 * | 11/2009 | Sheats | 438/108 |
| 2004/0016114 A1 * | 1/2004 | McAllister et al. | 29/830 |
| 2004/0227218 A1 * | 11/2004 | Farnworth et al. | 257/678 |

* cited by examiner

*Primary Examiner* — Nitin Parekh
(74) *Attorney, Agent, or Firm* — Mark Levy; Lawrence R. Fraley; Hinman, Howard & Kattell

(57) ABSTRACT

A method of forming a compressible contact structure on a semi-conductor chip which comprises bonding a compressible polymer layer to the chip's surface, forming a plurality of openings within the layer, depositing electrically conductive material within the openings to form electrical connections with the chip's contacts, forming a plurality of electrically conductive line elements on the polymer layer extending from a respective opening and each including an end portion, and forming a plurality of contact members each on a respective one of the line segment end portions. The compressible polymer layer allows the contact members to deflect toward (compress) the chip when the contact members are engaged by an external force or forces. A semi-conductor chip including such a compressible contact structure is also provided.

17 Claims, 4 Drawing Sheets

SEMI-CONDUCTOR CHIP WITH COMPRESSIBLE CONTACT STRUCTURE AND ELECTRONIC PACKAGE UTILIZING SAME

FIELD OF THE INVENTION

The present invention relates to a novel method of producing flexible interconnections for semi-conductor chips (also referred to in the industry as integrated circuits) and, in particular, although not limited thereto, to the provision of forming compressible (compliant) interconnections adapted for coupling chip(s) to a corresponding circuitized substrate (such as a chip carrier or printed circuit board) designed for having single and multiple semi-conductor chips mounted thereon. Even more particularly, the invention relates to formation of such compressible interconnections where solder balls may be used as interconnecting elements, although the use of such solder balls is not essential for effective operation of the invention.

BACKGROUND OF THE INVENTION

Typically, semi-conductor chips have been connected to electrical circuit features including pads and lines (traces) on mounting substrates by wire bonding, tape-automated bonding, and flip-chip bonding. In wire bonding, the chip is positioned on a substrate with a bottom or back surface (not including contacts thereon) of the chip abutting the substrate and with the contact-bearing top surface facing upwardly. Individual wires (gold or aluminum) are connected between the chip's contacts and respective substrate pads. In tape automated bonding, a flexible dielectric tape with a prefabricated array of leads thereon is positioned over the chip and substrate and the individual leads are bonded to the chip's contacts and substrate pads. A common problem with both wire bonding and conventional tape automated bonding is that the substrate pads are oriented externally of the substrate area covered by the positioned chip. This requires the entire assembly to be substantially larger than it otherwise would be. Because the speed with which a microelectronic assembly operates is inversely related to its size, this much larger structure presents a relatively serious drawback, especially when considering the high-density (and high-speed) microelectronic package structures mandated today.

To overcome these limitations, flip-chip mounting has been developed. In this methodology, the actual contact-bearing surface of the chip is placed face down on the substrate's upper surface. Each chip contact is joined by a solder bond, e.g., formed from a solder ball, to a corresponding contact pad on the substrate. That is, this method involves positioning several solder balls on the substrate or chip, juxtaposing the chip with the contact substrate in the front-face-down orientation over the substrate's contact surface, and melting (reflowing) the solder. In some situations, this melting or reflow process is referred to as controlled collapse chip connection (C4). Most significantly, this flip-chip process yields a very compact assembly, which occupies an area of the substrate no larger than the area of the chip itself. This area, understandably, is less than that of the area required for assemblies formed by the aforementioned wire-bonding and tape automated bonding, thereby resulting in advantages in area and speed for the resulting package.

There are, however, at least two potential problems associated with flip-chip technology. One involves the requirement to use an under-fill material (also referred to in the industry as encapsulating material) to surround the formed solder connections and thereby protect same during assembly operation. The use of such material adds to the overall cost of the final package, but also presents problems with respect to rework and repair of the package structure should it become inoperative for any reason. The encapsulating material is hardened at such a time. Its removal is both difficult from a manufacturing standpoint, but also potentially damaging to the protected connections.

A second and perhaps most important potential problem with flip-chip methodology is the formation of thermal stresses in the area of the formed connections. The solder bonds between the chip and substrate contacts are substantially rigid. Changes in the size of the chip and of the substrate due to thermal expansion and contraction during package operation create substantial stresses in these rigid bonds, which in turn can lead to bond fatigue failure. That is, these contact-to-contact connections, also referred to in the art as input/output (I/O) connections, are normally subject to substantial stresses due to thermal cycling within the package during package operation. For example, electrical power dissipated during operation tends to heat up both the substrate and associated chip or chips, and, when the operation is terminated, both the chip(s) and substrate cool. Because the substrate and the chip(s) are constructed of significantly different materials, which in turn have different coefficients of thermal expansion (CTEs), the chip(s) and substrate expand and contract by different amounts and, significantly, at different rates. This motion of the chip(s) relative to the substrate may cause movement of the I/O connections, placing these under mechanical stress. Repeated occurrence of these stresses may in turn cause breakage of the I/O connections and corresponding ultimate failure of the chip(s) and thus the entire package. When forming packages utilizing an organic chip carrier (where the substrate is of organic material, much desired in many of today's products), there are even greater differences in the CTEs than in previous packages where ceramic or similar material was used for the substrate members. Consideration must also be given to the different CTE of the solder material used to form the bonds between each respective mating contact pair.

One attempt to overcome the foregoing flip-chip problem has involved the use of separate interposers or the like structures between the chip(s) and accommodating substrates. Such structures usually have a plurality of terminals disposed on a flexible, sheet-like layer of dielectric, e.g., polymer material. In one example of the use of such an interconnecting structure, the interposer may be disposed on the front or contact-bearing surface of the chip with the interposer's terminals facing upwardly, away from the chip. The terminals are then connected to the contacts of the chip. This connection may be accomplished by bonding prefabricated leads on the interposer to the chip contacts, using a specific tool designed for this purpose. The completed chip-interposer assembly is then connected to a substrate, e.g., a printed circuit board or a chip carrier, by bonding the contacts of the interposer to the desired, corresponding contacts of the substrate. Because the leads and the dielectric layer of the interposer are flexible, the terminals on the interposer may move relative to the contacts on the chip without imposing significant stresses on the bonds between the leads and the chip, or on the bonds between the contacts and the substrate. This resulting assembly may thus compensate for thermal effects. Moreover, if the interposer includes a compliant (e.g., elastomeric) layer, this compliant structure permits displacement of the individual interposer contacts in an independent manner relative to the chip.

The following patents describe various chip connection structures, including those involving the use of interposers and the like. As seen, some of these involve the formation of compressible (also referred to as compliant or flexible) contact structures on the chip. The listing of these patents is not to be construed that any are prior art to the presently claimed invention. Nor is the listing thereof an acknowledgement that an exhaustive search of the prior art has been completed.

In U.S. Pat. No. 4,845,542, issued to Bezuk, et al. for "Interconnect For Layered Integrated Circuit Assembly" there are described electrical and/or mechanical interconnections between adjacent wafers (chips) within integrated circuit assemblies and structural integrity of those interconnections under temperature cycling conditions. Laser-assisted chemical vapor deposition is utilized to fabricate precisely configured metal posts, which serve as such interconnections.

In U.S. Pat. No. 5,148,265, issued to Khandros, et al. for "Semiconductor Chip Assemblies With Fan-In Leads" there is described a semi-conductor chip having contacts on the periphery of its top surface with an interposer overlying the central portion of the top surface. Peripheral contact leads extend inwardly from the peripheral contacts to central terminals on the interposer. The terminals on the interposer may be connected to a substrate using techniques commonly employed in surface mounting of electrical devices, such as solder bonding. The leads, and preferably the interposer, are described as being flexible so that the terminals are movable with respect to the contacts on the chip, to compensate for differential thermal expansion of the chip and substrate. The interposer may be provided with a compliant layer disposed between the terminals and the chip to permit slight vertical movement of the terminals towards the chip during testing operations.

In U.S. Pat. No. 5,148,266, issued to Khandros, et al. for "Semiconductor Chip Assemblies Having Interposer And Flexible Head" there is described a semi-conductor chip assembly which is mounted to contact pads in a compact area array, in which an interposer is disposed between the chip and the substrate. The contacts on the chip are connected to terminals on the interposer by flexible leads extending through apertures in the interposer. The terminals on the interposer in turn are bonded to the contact pads on the substrate. Flexibility of the leads permits relative movement of the contacts on the chip relative to the terminals and the contact pads of the substrate and hence relieves the stresses caused by differential thermal expansion.

In U.S. Pat. No. 5,455,390, issued to Distefano, et al. for "Microelectronics Unit Mounting With Multiple Lead Bonding" there is described the use of a flexible, dielectric top sheet having top and bottom surfaces with a plurality of terminals mounted on the top sheet. A support layer is disposed underneath the top sheet, this support layer having a bottom surface remote from the top sheet. A plurality of electrically conductive, elongated leads are connected to the terminals on the top sheet and extend generally side by side downwardly from the terminals through the support layer. Each lead has a lower end at the bottom surface of the support layer. The lower ends of the leads have conductive bonding materials as, for example, eutectic bonding metals. The support layer surrounds and supports the leads.

In U.S. Pat. No. 5,863,814, issued to Alcoe, et al. for "Electronic Package With Compressible Heatsink Structure" there is described an electronic package wherein a semi-conductor chip on a circuitized substrate is thermally coupled to a heat sink in a separable manner using a plurality of compressible, thermally conductive members (e.g., solder balls). These members are compressed and permanently deformed as part of the thermal coupling.

In U.S. Pat. No. 6,086,808, issued to Sørensen, et al. for "Repositioning Of Articles Between Different Positions Within An Intermittently Accessible Space" there is described the formation of pads (contacts) which are attached to a high density printed circuit board having a plurality of thru-holes opening on the top surface. A plurality of these pads are formed on a carrier sheet so that each of the pads have a copper layer proximate to the carrier sheet and a joining metal layer formed on top of said copper layer. The plurality of pads are positioned on the carrier sheet so that these are aligned with the thru-hole pattern on the top surface of the PCB, the pads being laminated to the thru-holes on the top surface using the joining metal, and the carrier sheet being separated from the plurality of pads that are joined to the thru-holes so that the copper layer is exposed. The pads may possess a variety of shapes such as disk-shaped, elongated, or rectangular, and can cover one or multiple thru-holes. An electrical component may be soldered to the pad. The pad and thru-hole may be compressed so that the top surface of the pad is even or flush with the top surface of an external dielectric surface.

In U.S. Pat. No. 6,104,087, issued to Distefano, et al. for "Microelectronic Assemblies with Multiple Leads" there is described a micro-electronic connection component which includes a dielectric sheet having an area array of elongated, strip-like leads. Each lead has a terminal end fastened to the sheet and a tip end detachable from the sheet. Each lead extends horizontally parallel to the sheet, from its terminal end to its tip end. The tip ends are attached to a second element, such as another dielectric sheet or a semi-conductor wafer (chip). The first and second elements are then moved relative to one another to advance the tip end of each lead vertically away from the dielectric sheet and deform the leads into a bent, vertically extensive configuration. The preferred structures provide semi-conductor chip assemblies with a planar area array of contacts on the chip, an array of terminals on the sheet positioned so that each terminal is substantially over the corresponding contact, and an array of metal S-shaped ribbons connected between the terminals and contacts. A compliant dielectric material may be provided between the sheet and chip, substantially surrounding the S-shaped ribbons.

In U.S. Pat. No. 6,150,255, issued to Downes, Jr., et al. for "Method of Planarizing A Curved Substrate and Resulting Structure" there is described a method for providing a planarized substrate with dendritic connections of solder balls, especially a multilayer ceramic substrate is provided. In the case where the substrate has a raised central portion on the top surface, on which are disposed top surface metallurgy pads, a layer of conformable photoimagable material is placed over the top surface. The photoimagable material is exposed and developed in a pattern corresponding to the pattern of the top surface metallurgy pads to form via holes in the photoimagable material. Copper is plated in the vias in contact with the top surface metallurgy pads. The exposed surface of the photoimagable surface is then planarized, preferably by mechanical polishing to form a flat planar surface, with the ends of the vias exposed. Dendritic connector pads are then grown on the exposed ends of the vias to which solder ball connections of a chip are releasably connected.

In U.S. Pat. No. 6,187,615, issued to Kim, et al. for "Chip Scale Packages And Methods For Manufacturing The Chip Scale Packages At Wafer Level" there is described a chip scale package (CSP) manufactured at wafer-level and including a chip, a conductor layer for redistribution of the chip pads of the chip, one or two insulation layers and multiple bumps, which are interconnected to respective chip pads by the conductor layer and are the terminals of the CSP. In addition, in order to improve the reliability of the CSP, a reinforcing layer, an edge protection layer and a chip protection layer are provided. The reinforcing layer absorbs stress applied to the bumps when the CSP are mounted on a circuit board and used for an extended period, and extends the life of the bumps.

In U.S. Pat. No. 6,211,572, issued to Fjelstad, et al. for "Semiconductor Chip Package With Fan-In Leads" there is described a compliant semi-conductor chip package with fan-in leads and a method for manufacturing same. The package contains a multiplicity of bond ribbons connected between the contacts of a semi-conductor chip and corresponding terminals on a top surface of a compliant layer. The compliant layer provides stress relief to the bond ribbons encountered during handling or affixing the assembly to an external substrate. The chip package also contains a dielectric layer, adjacent ends of the bond ribbons. The dielectric layer relieves mechanical stresses associated with the thermal mismatch of assembly and substrate materials during thermal cycling. The assembly can be manufactured without the need for any bond wiring tools since the bond ribbons are patterned and formed during a standard photolithographic stage within the manufacturing process.

In U.S. Pat. No. 6,281,111, issued to Ohsumi for "Semiconductor Apparatus and Method For Fabricating The Same" there is described a semi-conductor integrated circuit including a conductive pattern, an insulating layer formed on the semi-conductor integrated circuit to form a plurality of base members having uneven heights, an opening formed through the insulating layer to expose a part of the conductive pattern and a conductive layer formed on the insulating layer and the opening.

In U.S. Pat. No. 6,372,527, issued to Khandros, et al. for "Methods of Making Semiconductor Chip Assemblies" there is described a method of making semi-conductor chip assemblies which includes providing a semi-conductor wafer including a plurality of semi-conductor chips having contacts on a contact bearing surface thereof and providing a substrate having a first surface with a plurality of conductive terminals located thereon and a second surface. The substrate is then assembled with the wafer so that the terminals are electrically connected to the contacts on the chips and portions of the substrate are removed to expose the terminals. In certain embodiments, an encapsulating material may be injected between the wafer and the substrate for providing a compliant layer.

In U.S. Pat. No. 6,521,970, issued to Takiar, et al. for "Chip Scale Package With Compliant Leads" there is described an integrated circuit structure having an air gap formed between the integrated circuit die of the structure and compliant leads located over and conductively attached to the die. Contact bumps offset on the compliant leads provide for connection of the integrated circuit structure to other substrates. In some embodiments, the compliant leads include a conductive layer overlaid with an outer resilient layer, and may further include an inner resilient layer beneath the conductive layer. The outer resilient layer has a via (hole) formed through it exposing the underlying conductive layer. This via hole is offset along the compliant lead a horizontal distance from the bond pad to which the compliant lead is conductively coupled. The chip scale structure provides a compliant connection between the die and any substrate to which the die is attached.

In U.S. Pat. No. 6,528,349, issued to Patel, et al. for Monolithically-Fabricated Compliant Wafer-Level Package With Wafer Level Reliability And Functionality Testability" there is described a monolithically fabricated compliant wafer level package having a compliant layer and a compliant interconnect passing therein, the compliant interconnects being provided so that electrical and mechanical connections may be supported across the compliant layer. These are also constructed so that stresses resulting from motion of various electrical components are accommodated. In the described method of providing a substrate having such a compliant layer, the compliant layer includes a via hole that exposes a die pad on the substrate.

In U.S. Pat. No. 6,642,083, issued to Miyazaki, et al. for "Semiconductor Device and Manufacturing Method Thereof" there is described a Ball Grid Array (BGA) type semi-conductor package which includes a semi-conductor chip formed with bonding pads, an elastomer bonded to the semi-conductor chip, a flexible wiring substrate bonded to the elastomer and formed with wirings connected at one end of the bonding pads of the semi-conductor chip, a solder resist formed on the main surface of the flexible wiring substrate and solder bump electrodes connected to the other ends of the wirings. The solder bump electrodes are connected with the wirings by way of through holes formed in the resist.

In U.S. Pat. No. 7,292,055, issued to Egitto, et al. for "Interposer For Use With Test Apparatus" there is described an interposer in which at least two dielectric layers bonded to each other sandwich a plurality of conductors therebetween. The conductors each electrically couple a respective pair of opposed electrical contacts, which protrude from openings within the dielectric layers. The resulting interposer is ideally suited for use as part of a test apparatus to interconnect highly dense patterns of solder ball contacts of a semi-conductor chip to lesser dense arrays of contacts on the apparatus's printed circuit board.

In U.S. Pat. No. 7,455,915, issued to Johnson for Selective Application Of Conductive Material To Substrates By Pick And Place of Compliant Contact Arrays" there is described the application of a conductive material with a compliant under layer onto selected pads of a substrate, includes forming at least one "padstack" by patterning a sheet including a stack of material layers. These padstacks may include a first conductive top layer, one or more underlying layers, and a bottom attachment layer, such as a solder layer. At least one flexible, or compliant, layer is disposed in the sheet between the top and attachment layers. The compliant layer may be a conductive elastomer. The top layer of the padstacks are adhered to a soluble tape, and this composite structure is moved into place over the circuit board by means of a pick and place operation. The placement of the padstacks is followed by a solder reflow to adhere the padstacks to the contact pads of the substrate, and by a wash cycle with a solvent to remove the soluble tape.

In U.S. Pat. No. 7,456,046, issued to Buchwalter, et al. for "Method To Create Flexible Connections For Integrated Circuits" there is described a method of producing flexible interconnections for integrated circuits, and, in particular, the forming of flexible or compliant interconnections preferably by a laser-assisted chemical vapor deposition process in semi-conductor or glass substrate-based carriers which are employed for mounting and packaging multiple integrated circuit chips.

In U.S. Pat. No. 7,511,518, issued to Egitto, et al. for Method Of Making An Interposer" there is described a method of making an interposer in which at least two dielectric layers are bonded to each other to sandwich a plurality of conductors therebetween. The conductors each electrically couple a respective pair of opposed electrical contacts, which are formed within and protrude from openings, which are also formed within the dielectric layers as part of this method. The resulting interposer is ideally suited for use as part of a test apparatus to interconnect highly dense patterns of solder ball contacts of a semi-conductor chip to lesser dense arrays of contacts on the apparatus' printed circuit board.

In U.S. Pat. No. 7,534,652, issued to Haba, et al. for "Microelectronic Elements With Compliant Terminal Mountings And Methods For Making The Same" there is described a dielectric structure formed by molding so that a first surface is shaped by contact with the mold. The opposite second surface is applied to the front surface of a wafer element. The dielectric layer may include protruding bumps and terminals may be formed on the bumps. The bumps may be of a precise height. The terminals lie at a precisely controlled height above the front surface of the wafer element and may include projecting posts, which extend above a surrounding solder mask layer.

As defined below, the present invention comprises the formation of a compliant-type contact structure on a semiconductor chip surface which is able, in turn, form effective electrical connections to a hosting substrate such as a PCB or chip carrier, with or without using solder bonds. The resulting formed connections do not require the use of under-fill or encapsulating materials, but such materials may be used if desired. Absent use of such under-fill material, however, the formed interconnections as defined herein enable rework and repair of the formed final package structure, thereby significantly reducing costs incurred if such a complete package were found to be inoperative to the extent that full replacement was deemed necessary.

It is believed that such an invention will represent a significant advancement in the art.

SUMMARY OF THE INVENTION

It is a primary object of the invention to enhance the art of semi-conductor chips and that of the products utilizing same.

It is another object of the invention to provide a new and unique connection structure for semi-conductor chips, which facilitates repair and/or replacement of the chip with respect to the hosting circuitized substrate on which the chip is positioned and coupled.

It is yet another object of the invention to provide a method of making such a structure, which may be performed on a mass scale, and which thereby represents cost savings over many known such interconnection structures as described in the patents cited hereinabove.

According to one aspect of this invention, there is provided a method of forming a compressible contact structure on a semi-conductor chip. The method comprises providing a semi-conductor chip having at least one substantially planar surface including a plurality of individual contacts thereon. A compressible polymer layer is bonded to the planar surface to substantially cover the individual contacts. This polymer layer has an outer surface, forming a plurality of openings within the compressible polymer layer, each of these openings extending through the compressible polymer layer from the outer surface to expose a corresponding one of the contacts. Electrically conductive material is deposited within the openings to form electrical connections with the individual contacts and a plurality of electrically conductive line elements on the outer surface of the polymer layer. Each of these conductive line elements extends from a respective one of the openings a predetermined distance from the opening and including an end portion, and forming a plurality of contact members each on a respective one of the line segment end portions. The compressible polymer layer allows the plurality of contact members to deflect toward the substantially planar surface of the semi-conductor chip when these contact members are engaged by external forces.

According to another aspect of the invention, there is provided a semi-conductor chip including at least one substantially planar surface having a plurality of individual contacts thereon and a compressible contact structure. This compressible contact structure comprises a compressible polymer layer bonded to the planar surface, the polymer layer having an outer surface and a plurality of openings within the compressible polymer layer. Each of these openings extends through the compressible polymer layer from its outer surface to expose a corresponding one of the chip's contacts, electrically conductive material within the plurality of openings in electrical connection with the individual contacts, and a plurality of electrically conductive line elements on the outer surface of the layer. Each of these conductive line elements extends from a respective one of the openings a predetermined distance from the opening and includes an end portion, and a plurality of contact members reside on a respective one of the end portions. The compressible polymer layer allows the plurality of contact members to deflect toward (compress) the substantially planar surface of the chip when the plurality of contact members is engaged by external forces.

BRIEF DESCRIPTION OF THE DRAWINGS

A more complete understanding of the present invention may be obtained by reference to the accompanying drawings, when considered in conjunction with the subsequent detailed description, in which.

DETAILED DESCRIPTION OF THE PREFERRED EMBODIMENTS

Figure 1:
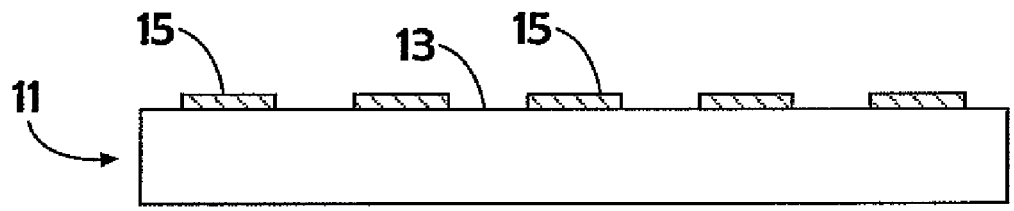
FIGS. 1-6 are side-elevational views, partly in section, and on an enlarged scale, illustrating the steps of forming a compressible contract structure on a semi-conductor chip in accordance with one embodiment of the invention, FIGS. 5 and 6 being on a much-enlarged scale over the views of FIGS. 1-4 for ease of illustration purposes.

For a better understanding of the present invention, together with other and further objects, advantages and capabilities thereof, reference is made to the following disclosure and appended claims in connection with the above-described drawings. It is understood that like numerals will be used to indicate like elements from drawing figure to drawing figure.
DEFINITIONS The following are definitions of some of the more significant terms used in this Detailed Description.

By the term "circuitized substrate" as used hereinbelow is meant to include substrates having at least one (and, preferably, a plurality of) dielectric layer(s) and at least one (and, preferably, a plurality of) electrically conductive layer (s). If more than one of each, the layers are arranged in an alternating manner. Examples of dielectric materials usable for such substrates include fiberglass-reinforced epoxy resins (some referred to as "FR-4" dielectric materials in the art, for the flame retardant rating of same), polytetrafluoroethylene (e.g., Teflon), polyimides, polyamides, cyanate resins, photoimageable materials, and other like materials, including combinations thereof. Examples of conductor materials usable in such substrates include copper or copper alloys, but may include or comprise additional metals (e.g., nickel, aluminum, etc.) or alloys thereof. Such conductor materials are used to form layers, which may serve as power, signal and/or ground layers. If as a signal layer, several conductor lines and/or pads may constitute the layer, while if used as power or ground, such layers will typically be of substantially solid construction. Combinations of signal and power and/or ground are possible. One particular example of a circuitized substrate for use herein is a chip carrier sold under the name HyperBGA® by the Assignee of this invention, Endicott Interconnect Technologies, Inc. (HyperBGA being a registered trademark of Endicott Interconnect Technologies, Inc.). Endicott Interconnect Technologies, Inc. also produces and sells many PCBs, which are capable of serving as circuitized substrates, either to accept a semi-conductor chip having the unique compressible structure defined herein as well as a chip carrier having one or more such semi-conductor chips thereon. It is believed that the teachings of the instant invention may also be applicable to what are known in the art as "flex" (thin) circuits (which use extremely thin layers of dielectric material such as polyimide).

By the term "conductive paste" as used herein is meant an electrically conductive paste composition, including solder paste, adapted for use between conductive members to provide an electrical path between these members. Examples include silver based conductive adhesive pastes available commercially under the trade name "Ablebond 8175" from Ablestick of Delhi, India, and under the trade name "CB100" from the E. I. du Pont de Nemours & Company. Another example of a conductive paste usable herein is sold under the trade name "DA-5915" by Engineered Materials Systems of Delaware, Ohio. "DA-5915" includes about eighty-eight percent by weight silver flakes and about twelve percent by weight of an anhydride epoxide as the organic binder, and is described as having a decomposition temperature of approximately 340 degrees C. An example of suitable eutectic solder paste that may be used is Alpha 3060 from Alpha Metals (Jersey City, N.J.).

By the term "electronic package" as used herein is meant a package including at least one circuitized substrate as defined above, and at least one electronic component (semi-conductor chip) positioned on the circuitized substrate and electrically coupled thereto.

By the term "high density" as used herein to define the pattern of electrical conductors of the electronic device (e.g., semi-conductor chip), as well as the pattern of electrical conductors formed as part of the compressible contact structure on said device, and further as well as the corresponding pattern of conductors designed to receive these for being electrically coupled thereto, is meant a pattern wherein the conductors each possess a maximum width within the range of from only about 0.2 mils to about 1.0 mil and are spaced apart from each other (at the nearest point of edges of adjacent conductor features) within the range of only about 0.2 mils to about 1.0 mil (as defined above, a mil is equal to 0.001 inch).

By the term "high-speed" as used herein is meant signals of high frequency. Examples of such signal frequencies attainable for the include those within the range of from about 3.0 to about 10.0 gigabits per second (GPS). These examples are not meant to limit this invention, however, because frequencies outside this range, including those higher, are attainable.

By the term "information handling system" as used herein shall mean any instrumentality or aggregate of instrumentalities primarily designed to compute, classify, process, transmit, receive, retrieve, originate, switch, store, display, manifest, measure, detect, record, reproduce, handle or utilize any form of information, intelligence or data for business, scientific, control or other purposes. Examples include personal computers and larger processors such as servers, mainframes, etc.

By the term "solder element" as used herein is meant to include conductive solder paste compositions as defined above, in addition to solder balls or the like structures known in the art. These compositions may also include lead-free solder compositions, of more recent familiarity in the industry.

FIGS. 1-6 are side-elevational views, partly in section, and on an enlarged scale, illustrating the steps of forming a compressible contract structure on a semi-conductor chip in accordance with one embodiment of the invention. In FIG. 1, there is shown a semi-conductor chip 11 having a planar upper surface 13 with a plurality of individual contacts 15 thereon. Contacts 15 may be conventional metal (e.g., aluminum), and of a conventional number spacedly oriented in a known pattern for such electronic components. Chip 11, which may be any kind of chip (e.g., CMOS, DRAM, EPROM, ROM, RISC), may include a body of single crystal silicon, as is known, and may include as many as a billion or more transistors, as are possible with today's advanced integrated circuit products. In one example, the number of externally positioned contacts 15 which form the connection locations to other electronic structures such as circuitized substrates (e.g., chip carriers) may range from as few as about 30 to as many as about 12,000.

Figure 2:
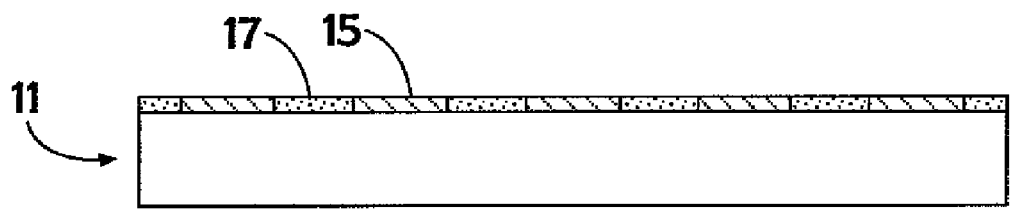

In FIG. 2, a layer of adhesive 17 is deposited onto surface 13 as shown. The adhesive 17 is of a substantially similar thickness as the adjacent contacts 15 which are surrounded by the adhesive in a contiguous manner. In one example, the adhesive may have a thickness of from about 0.1 mil to about 2.0 mils. (A mil, as stated, is understood to be ¹⁄₁₀₀₀ of an inch.) One example of a usable adhesive for this invention is a soft, thermally conductive adhesive, such as GE32XX silicone adhesive from General Electric Company, Waterford, N.Y. Alternatively, "dots" of such adhesive may be placed in predetermined positions on surface 13, in which case the adhesive may not directly contact the adjacent contacts 15 but are slightly spaced therefrom. Another example is a suitable acrylic-based adhesive sold under the trademark SCOTCH brand 467 MP or 468 MP Roll Laminating Adhesive available from 3M Corp. in Minneapolis, Minn. Adhesive 17 may comprise other materials, including thermosetting adhesives. One method of applying adhesive layer 17 is to use a conventional screen-printing process used in the substrate industry. It is also possible not to use adhesive of the type defined above, but instead use alternative means. For example, it is possible to spin on a polyimide or similar material layer, which should work as well as the above adhesive. The invention is thus not limited to use of adhesive only.

Figure 3:
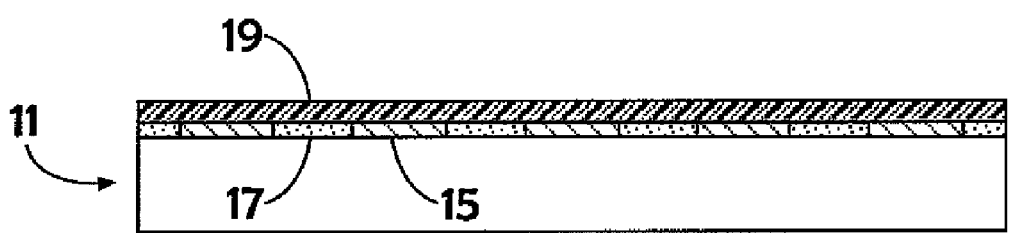

In FIG. 3, a compressible polymer layer 19 is positioned over adhesive layer 17 (and adjacent contacts 15) and then bonded directly to the adhesive (and thus surface 13) as shown. The polymer material of layer 19 covers the individual contacts 15 and is also bonded directly to the upper surfaces thereof. In one example, layer 19 may have a thickness of from about 0.1 mils to about 5.0 mils. One example of a suitable polymer for layer 19 is sold under the product name MYLAR®, a polyester film available from E. I. du Pont de Nemours and Company (du Pont.) MYLAR is a registered trademark of du Pont for a specific family of products made from polyethylene terephthalate (PET) resin. This material possesses the highly desirable characteristics needed to satisfy the design requirements herein, including of course, compressibility, as well as high-tensile strength, chemical and dimensional stability, and electrical insulation. Another polymer material suitable for this purpose is sold under the product name PYRALIN® polyimide, a material also available from du Pont. (PYRALIN is a registered trademark of du Pont.) The invention is not limited to these two materials, as others are possible. For example, layer 19 may comprise a photoimageable material. One example is what is referred to in the art as an ASMDF (Advanced Soldermask Dry Film). This composition may include a solids content of from about 85 to about 90%, such solids comprising about 27% PKHC (a phenoxy resin), 41% of Epirez 5183 (a tetrabromobisphenol A), 23% of Epirez SU-8 (an octafunctional epoxy bisphenol A formaldehyde novolac resin), 54% UVE 1014 photoinitiator; 0.07% ethylviolet dye; 0.03% FC 430 (a fluorinated polyether nonionic surfactant from 3M Company), and about 4% Aerosil 380 (an amorphous silicon dioxide from the Degussa Corporation) to provide the solid content. A solvent is present in such a material from about 11 to about 13.5% of the total photoimageable dielectric composition. This composition is known in the art and further description is not deemed necessary. In another embodiment, it may be possible to apply more than a single layer, e.g., to impart added flexibility to this part of the invention. For example, it may be possible to provide a thin first layer of material designed to control electrical performance and a second also thin layer with enhanced mechanical properties.

Figure 4:
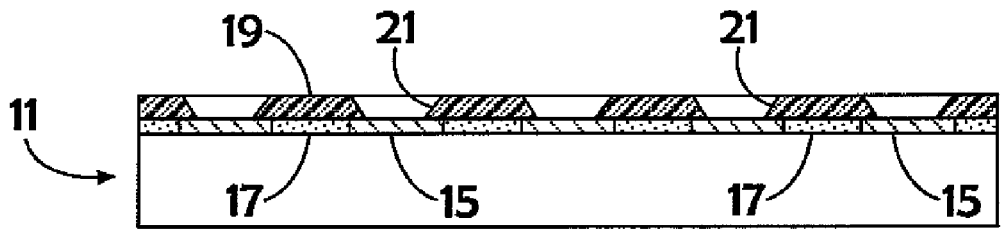

FIG. 4 represents what is considered one of the most important aspects of this invention, this involving the formation of several openings 21 within polymer layer 19. Preferably, these openings are formed directly above the respective contacts 15, but may also be formed slightly offset from the contacts with lateral grooving or the like provided within the polymer material to access the contacts. In the FIG. 4 embodiment, an opening 21 is formed directly above each of the respective contacts 15, so as to expose the upper surfaces of each contact. The invention is not limited to the particular tapered configuration for openings 21 shown in FIG. 4. The sidewalls, for example, may be substantially vertical. The resulting configuration depends in part on the process used to form these openings.

In one embodiment, a laser is used, preferably a Nd:YAG laser. Laser drilling is a preferred approach to give the highly dense pattern of openings required for a relatively large number of associated contacts as found on many of today's semiconductor chips. If a laser is used, the internal sidewalls will preferably have the tapered configuration shown. Laser drilling is a known procedure in the circuitized substrate art and further description is not considered necessary. Alternatively, it is also possible to form openings 21 using conventional photolithographic processing utilized in producing highly dense circuit lines, pads and other elements on known PCB and chip carrier products. If such a procedure is used, the compressible polymer layer 19 bonded to chip 11 may comprise a conventional photoimageable material. This photoimageable material may then be imaged using a glass or film master through, which ultraviolet (UV) light is passed. The unexposed photoimageable material of layer 19 is then removed utilizing an appropriate developing solution, e.g., propylene carbonate. The imaged photoimageable material is then metallized using one of the processes defined below.

Figure 5:
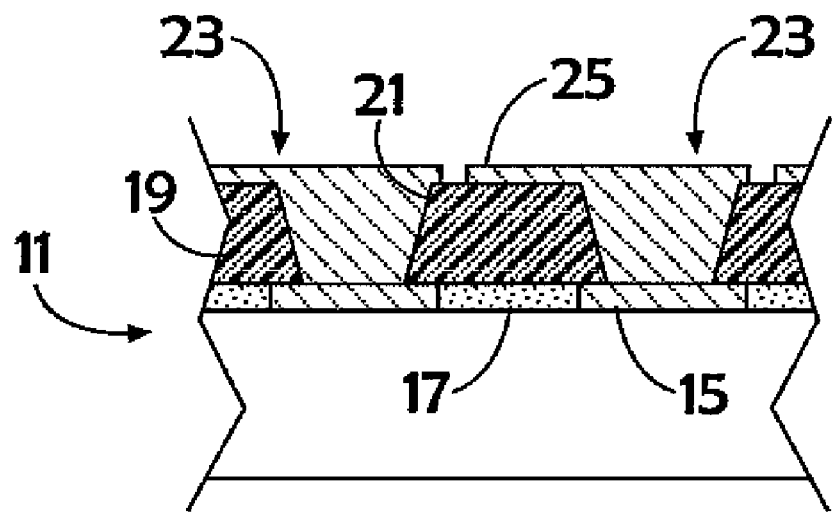

In FIG. 5 (much enlarged over the scale of FIGS. 1-4), a partial view showing only two of the several elements formed, electrically conductive material 23 is deposited within each of the openings 21. Significantly, a line element 25 of the same material 23 is also formed simultaneously with depositing of material 23 in openings 21 to extend along the upper surface of the polymer layer 19. Each opening 21 is shown as being filled in FIG. 5, but this is not meant to limit the invention. It is also possible to provide only a coating or thin layer of material 23 on the opening sidewalls. Regardless of the extent of deposition, however, a line element 25 is formed to extend from each opening as shown. In one example, each extending line element may possess a length of only about 1.0 to about 2.0 mils and a thickness of from about 0.2 mils to about 1.0 mil. If a layer or coating is plated onto the exposed sidewalls rather than complete opening fill, this layer or coating may have a thickness of from about 0.2 mil to about 1.0 mil. Such a layered embodiment may be further enhanced by the addition of conductive paste (defined above) within the recess remaining within each opening. Paste deposition processes are known in the industry and further description is not considered necessary.

Deposition of the desired electrically conductive material 23 within openings 21 and also to form the extending line elements 25, as well as to eventually form the contact members (defined below) on the end portions of the line elements 25, may be accomplished using conventional plating processes such as electroless, electrolytic, and sputter deposition. Sputter deposition represents one of the preferred approaches for depositing the conductive metallurgy 23, e.g., copper or copper alloy. In one example of such an approach, conductive copper or copper alloy molecules are deposited on the desired exposed sidewall surfaces of openings 21 and on the predetermined adjacent top surface regions of layer 19.

A sputter deposition chamber (not shown) is used and includes a target, which serves as a source for the metal molecules. Initially, the chamber is evacuated to remove impurities, following which Argon (or other applicable) gas is passed into the chamber. The Argon gas is ionized and accelerated by processes induced by a negative voltage source, such that energetic argon ions strike the target, causing molecules to be dislodged and ejected from the target and deposited on the desired surfaces. A metallic plate carrier is moved through the sputtering deposition chamber on a conveyor or, alternatively, the conveyor could represent a stationary platform such that the sputtering deposition process is turned off after a predetermined period of time. The sputtering deposition process may be adjusted to deposit a layer having a specified thickness to ensure continuous coverage of the desired surfaces. The thickness of the layer depends on molecular structural properties of the pertinent chemical compound in the layer. Understandably, this represents but one example of a sputtering process suitable for the invention. Further description is not considered necessary.

If electroless plating is used, deposition of the conductive material, e.g., again, copper or copper alloy, is achieved by contacting the exposed surfaces of the polymer layer with a solution comprising a copper ion source and a reducing agent. Electroless plating begins at locations where catalyst resides and continues until a desired plated thickness (such as defined above) is attained. In this manner a precisely defined thickness of plating may be achieved. Useful reducing agents may include hypophosphite, formaldehyde, formaldehyde precursors, homo-polymers of formaldehyde such as para-formaldehyde and trioxane, glyoxal, hydrazine borohydrides, amino boranes such as isopropylamine borane and morpholine borane, thiourea dioxides, alkali metal borohydrides and derivatives therefrom. One preferred reducing agent is formaldehyde.

In addition to the reducing agent, the electroless copper-plating bath may further contain an aqueous composition comprising a source of cupric ion, a complexing agent for the cupric ion, a pH adjuster, chemical stabilizers, surfactants and dissolved oxygen. The cupric ion source may be cupric sulfate or a cupric salt of the complexing agent to be employed. Examples of some suitable complexing agents include Rochelle salts, ethylene diamine tetra-acetic acid, the sodium (mono-, di-, tri-, and tetra-sodium) salts of ethylene diamine tetra-acetic acid, nitrilo tetra-acetic acid and its alkali salts, gluconic acid, gluconates, tri-ethanol amine, glucono (gamma-lactone), modified ethylene diamine acetates, such as N-hydroxy ethyl ethylene diamine tri-acetate. One preferred complexing agent is ethylene diamine tetra-acetic acid. If a surfactant is desired as part of the plating formulation to wet the surface of the roughened polymer material, various surfactants are possible, including, for instance, an ortho phosphate ester, available under the trade designation Rhodafac RE-610, from Chemtec Chemical Company, Chatsworth, Calif. Generally anionic and nonionic surfactants are compatible with the plating formulations. Further description is not considered necessary because such added steps of this process are known in the art.

If electrolytic plating is used to deposit conductive material 23, e.g., copper or copper alloy here as well, an electrolyte solution flows through a spacing between a cathode and anode, whereupon passage of electrical current causes the anode material to dissolve in the exposed openings 21 and on the selected locations intended for line elements 25. The substrate accepting such deposition is of course located within a housing containing such solution. Electrolytic plating is well known in the industry and further description is not considered necessary.

Each of the above processes, as mentioned, may be used to deposit the desired amount of metallurgy within the openings 21 and on the upper surface of layer 19 to form elements 25. Further, the selected process may be used to perform both opening and element deposition in a simultaneous manner. It is even further possible to use one of the processes to achieve deposition within opening 21 and another process different from the first to form the line elements 25. The invention as defined thus allows for a variety of processes to be used to thereby enable the manufacturer to use the process(es) most desirable to him/her, and thus perhaps the most cost effective.

Significantly, it is also possible to deposit electrically conductive material other than copper or alloys thereof. For example, the conductive material may be comprised of more than one metal, e.g., copper or copper alloy layering having gold filled conductive paste (not shown) deposited thereon using known mechanical screening, for example, through a metal mask. Therefore, the invention allows the use of additional conductive paste or the like materials to be deposited within the openings previously deposited with a "base" layer, e.g., copper or copper alloy. Conductive pastes as defined above may be successfully used.

Figure 6:
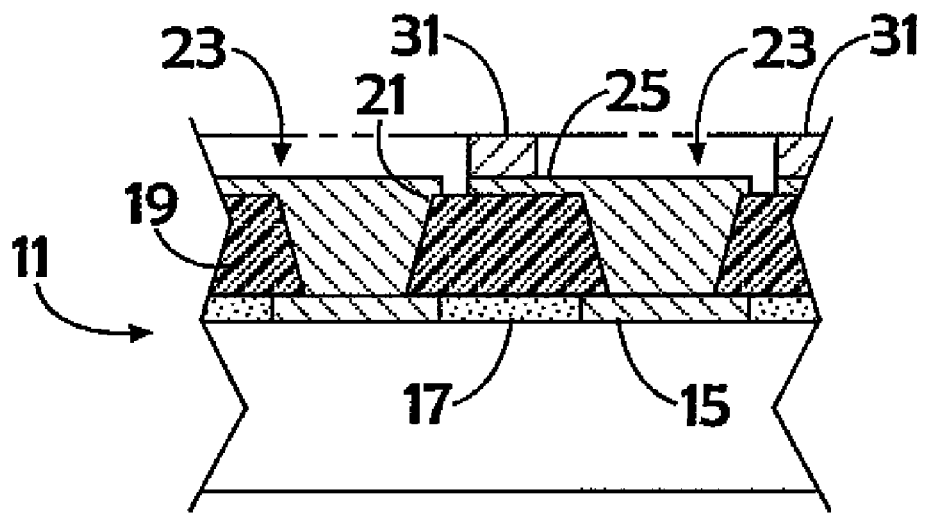

In FIG. 6 (on the same scale as FIG. 5, and thus also much-enlarged over the scale of FIGS. 1-4), there is shown the formation of individual contact members 31. Only two members 31 are shown in FIG. 6, it being understood that there are as many members as there are openings 21 with conductive material and associated extending line elements. Each member is disposed on a respective end portion of one of the line elements 25. Each contact member 31 preferably comprises metal such as copper or copper alloy, but may be comprise other suitable electrically conductive materials. Each contact member 31 may also have a conductive coating such as gold thereon.

In one example, each contact member 31 may possess a thickness of 0.5 mil and a diameter within the range of from only about 1.0 mil to about 2.0 mil. Formation of these members 31 is accomplished in one embodiment using conventional photolithographic processing used in the circuitized substrate industry to form circuit lines, pads, etc. As is known, such a process involves the depositing of a photoresist composition over the respective area and then exposing selected parts of this photoresist for eventual processing (either removal or retention with removal of other areas).

Various photoresist compositions are known in the art. When exposed to activating radiation, the photoresist composition is chemically altered in its solubility to certain solvents (developers). Two types of photoresist compositions (also referred to herein simply as "resist") are known and possible here. One is referred to as a negative acting resist which is, generally, a composition which is soluble in the utilized developer but, following exposure to the actinic radiation, becomes less soluble in this developer, thereby defining a latent image. The second type of resist is known as the positive acting resist which works in an opposite fashion to the negative resist in that actinic radiation renders the resist more soluble in the developer. One photoresist composition which may be used in the present invention is known as "PEPR 2400" photoresist, which is a positive acting waterborne resist (with negative charged micelles) sold by Rohm & Hass Electronic Materials (formerly Shipley Company and Ronel, Inc.), Marlborough, Mass. "PEPR 2400" resist may be applied by electrodeposition and provides resolution to as low as five microns. Being a positive acting resist, the developed areas (an alkaline developer is preferably used) of the resist are removed, thereby exposing the defined pattern of the underlying metallurgy (in this case, the end portions of line elements 25). Rinsing may be accomplished using de-ionized water and drying may be performed in a convection oven at about 105 degrees Celsius (C). This particular photoresist has been successfully used by the Assignee of this invention to produce circuitized substrates having high-density circuit patterns. As is known, such photolithographic processing involves the transferring of a pattern of geometric shapes on a mask to the respective areas. The mask may be a glass plate containing a pattern (e.g., a chromium pattern) of transparent and opaque regions to define the geometrical shapes.

In addition to the above, it is also possible, and in some instances preferred, to use a semi-additive plating process to form contact members 31. In one example, a relatively thin (1000 Angstroms to 6000 Angstroms) layer of metal, typically copper, can be deposited onto the surface of the substrate to be plated. This metal "seed layer" is commonly applied using sputter deposition and/or a chemical seed and electroless plating processes. Photoresist is then applied, exposed, and developed to generate a reverse mask; that is, the mask serves to precisely expose those areas of the substrate that will eventually have the metal traces thereon. Additional metal is then plated onto the substrate in the unmasked areas. The thickness of the metal is less than the thickness of the photoresist mask. Copper is commonly used for the metal, and subsequent plating steps can be employed to deposit other metals, for example nickel and gold, onto the surface of the copper. After plating, the photoresist is removed, exposing the thin layer of metal on the surface of the substrate. A quick etching step, or flash etch, is used to remove this thin seed layer, isolating the individual circuit features. Since the seed layer is much thinner than the plated features, the latter are not significantly distorted by the flash etch.

Following the above processing, any remaining photoresist is preferably removed. At this time, it is also possible to remove selected portions of the compressible polymer layer (e.g., the peripheral regions) so as to form a chip with compressible contact structure of smaller outer dimensions. Such removal may be accomplished using a conventional plasma etching process (e.g., using oxygen as the etchant), including using the formed line segments as masks. The unique structure as taught herein thus enhances such a removal operation because it omits the need for added masks. (There is no polymer where openings 21 are located, as is understood.)

Figure 7:
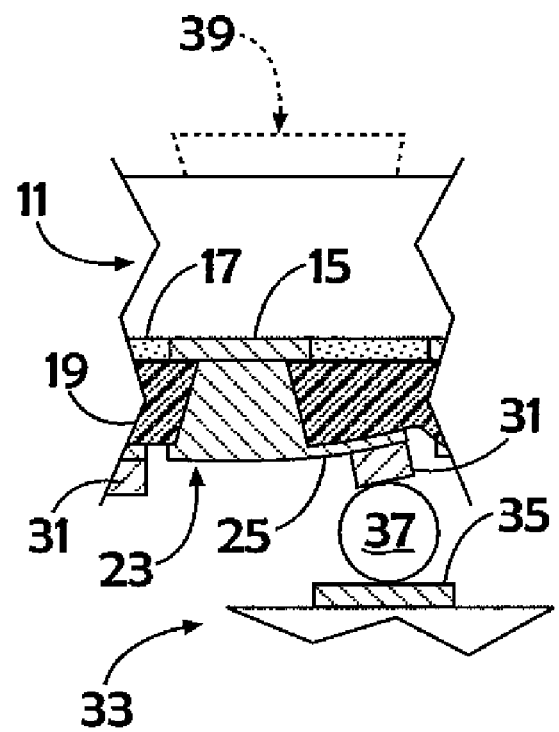
FIG. 7 is a partial side-elevational view, partly in section and on an even greater enlarged scale over previous FIGURES, showing one of the many possible couplings possible between a chip's contacts and respective contacting members of a circuitized substrate on which the chip is adapted for being positioned and electrically coupled.

FIG. 7, on a much larger scale than FIG. 6, illustrates the positioning of the chip 11 over a receiving substrate (i.e., chip carrier 33) such that the contact members 31 (only one shown due to the large scale presented) are able to directly or indirectly (shown) make electrical contact with associated, respective contacting members 35 on the upper surface of the substrate.

One particular example of a substrate suitable for use herein is the aforementioned chip carrier sold under the name HyperBGA by the Assignee, Endicott Interconnect Technologies, Inc. Chip 11 is seen in an inverted position, typical of that assumed when performing flip-chip solder bonding as defined in detail hereinabove. That is, chip 11 is oriented in a contact down position whereby contacts 15 face substrate 33. It is not necessary in the present invention to melt the respective solder elements 37 to satisfactorily achieve the necessary electrical couplings between members 31 and associated members 35. Solder elements 37, preferably of convention solder composition such as 63:37 tin:lead "eutectic" solder alloy or, alternatively, 90:10 tin:lead alloy, or even of the more recent lead-free compositions, are preferably positioned on the illustrated contact members 31 using conventional solder ball alignment and placement equipment (not shown).

Not having to heat the solder elements 37 represents a significant advantage of the present invention because it enables effective electrical coupling between chip and substrate without using a potentially harmful process due to high temperatures associated with known flip-chip bonding, in addition to the additional time and costs associated therewith. Briefly, it is only necessary in the broadest aspects of this invention to align the chip's contact members 31 having the solder elements 37 thereon, over the respective contacting members 35 on substrate 33 and press down on the chip (i.e., using a press member 39 shown in phantom in FIG. 7). Most significantly, positive coupling of the relatively solid solder ball 37 is accomplished because of the ability of the compressible polymer layer 19 to compress, as shown. That is, the supporting contact members 31 deflect inwardly toward the planar surface of chip 11, as do the respective solder elements 37 positioned on the end portions of these members.

The aforementioned compression allows the application of sufficient forces onto the chip by press 39 without harming the individual solder elements 37 or the pairs of aligned contact and contacting members 31 and 35. This represents an important feature of this invention, especially considering the extremely delicate nature of such high-density products of the type defined herein. More specifically, the force applied per contact 31 should be within the range of from about 0.2 Newton to about 1.2 Newtons, and even more specifically, from about 0.2 Newton to about 0.5 Newton. To obtain the total force, multiply this amount by the total number of contact members 31 (and thus contacts 15) utilized. Considering the lower number (30) of contacts within the range defined above (30 to 12,000), for example, if the number of contact members 31 is 30, the total force range will be from about 6 to about 36 Newtons, and in the more specific embodiment, from about 6 to about 15 Newtons. Considering the higher range (12,000), the resulting range will be from about 2400 to 14,400 Newtons, and in the more specific embodiment, from about 2400 to about 6000 Newtons.

Press member may form a part of the electronic package including chip 11 and substrate 33, or an alternative clamp member (shown in FIG. 8) may be utilized. Various additional examples of clamping members are known in the packaging art for use with non-solder contact applications and further description is not considered necessary.

As also stated above, effective coupling between the solder elements 37 and members 35 of substrate 33 may be accomplished by heating the solder elements in a conventional manner (e.g., within a convection oven) such as used in flip-chip processing. This heating may occur with the members 31 in the compressed orientation shown in FIG. 7 or without being so compressed. That is, compression is not essential for this alternative embodiment of the invention. Further details of such a process may be obtained from the foregoing detailed description such that added description is not needed. As further stated, it is also possible to provide a suitable under-fill material (not shown) to surround the solder bonds, or even the paired contact-to-contact bonds if such a material is desired by the customer.

Figure 8:
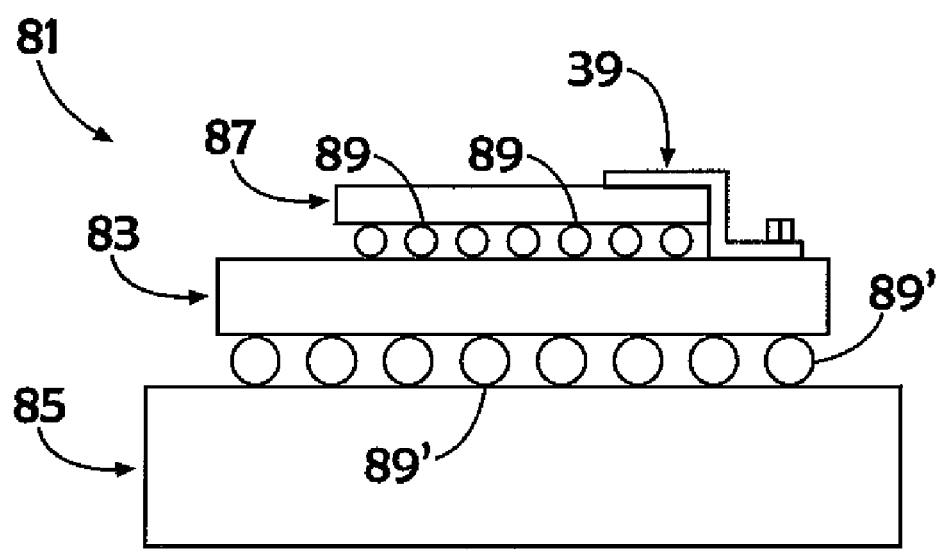
FIG. 8 is a side-elevational view, illustrating one example of a chip to hosting circuitized substrate electrical coupling according to one embodiment of this invention, in addition to the positioning and coupling of such a chip-substrate electronic package on a separate and larger hosting circuitized substrate (i.e., PCB), such that the resulting electrical assembly is then adapted for use in a still larger system such as an information handling system as illustrated below in FIG. 9 and as defined herein.

FIG. 8 illustrates one example of an electronic package 81 in which a semiconductor chip 87 having the compressible contact structure taught herein is positioned on and electrically coupled to a hosting circuitized substrate 83, in this case a HyperBGA chip carrier. The individual contact members 15 (not shown, for ease of illustration) of chip 87 are coupled to respective contacting members 35 (also not shown) of the chip carrier using the compressible contact structure of the invention wherein solder elements 89 are utilized. It is also understood that such couplings are possible without using solder elements or conductive pastes as explained above, so the solder element example shown is but one of others possible and not meant to limit this invention. Chip carrier 83, as shown, is adapted for being positioned on and electrically coupled to a larger circuitized substrate such as PCB 85, again using solder balls 89', following which PCB 85 may be used in a larger system such as an information handling system illustrated below and defined hereinabove. Such a chip-carrier-PCB combination may also be referred to as an electrical assembly, several of which may be used in such larger systems as information handling systems.

Figure 9:
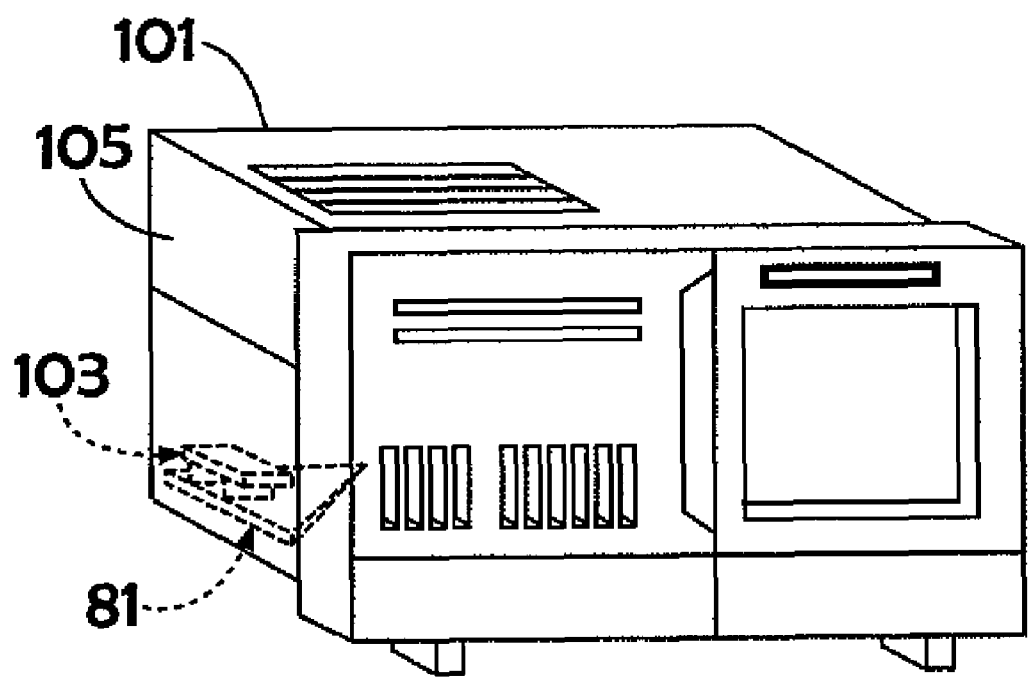
FIG. 9 represents an information handling system according to one aspect of the invention, which is capable of utilizing one or more of the electronic packages taught herein.

In FIG. 9, there is shown an information handling system 101 in accordance with one embodiment of the invention. System 101 may comprise a personal computer, mainframe computer, computer server, or the like, several types of which are well known in the art. System 101, as taught herein, may include one or more of the electrical assemblies shown in FIG. 8, including both PCB 85 and carrier 83, these being represented by the numeral 103 in FIG. 9. This completed assembly, shown hidden, may be mounted on a still larger PCB or other substrate (not shown), one example being a "motherboard" of much larger size, should such a board be utilized. These components are shown hidden because these are enclosed within a suitable housing 105 designed to accommodate the various electrical and other components, which form part of system 101. PCB 85 may itself instead comprise such a "motherboard" in system 101 and thus include additional electrical assemblies, including additional printed circuit "cards" mounted thereon, such additional "cards" in turn also possibly including additional electronic packages and other components as part thereof. It is thus seen and understood that the electronic packages in accordance with the unique teachings herein may be utilized in several various combinations. Further description is not believed necessary.

Thus there has been shown and described a new and unique method of forming a compressible contact structure on a semi-conductor chip (or similar electronic device) which provides advantageous features over known such chip contact structures, this method including the provision of high density patterns of conductors to assure a sound, effective plurality of connections between the chip's original pattern of conductors and those of a hosting circuitized substrate such as a chip carrier or PCB onto which the chip and its structure are positioned. As mentioned, such connections allow for the passage of high-speed signals thereacross, a highly desirable feature for today's more advanced package structures.

In addition, the chip to substrate connection structure taught herein substantially overcomes problems associated with CTE mismatches defined in detail above. The resulting electronic package as shown and described herein is adapted for use in larger systems such as information handling systems. The ability of the contacts of the compressible structure to compress when engaged by a predetermined force facilitates ease of repair of and access to the mated contacts, while also overcoming the requirement for use of under-fill (encapsulant), if use of such material is not desired. Significantly, the structure as defined herein is adaptable also to forming interconnections using conventional solder balls or the like elements, including using such solder elements, without the need for relatively high heat application associated with conventional flip-chip and other solder reflow operations. Even further, the invention is able to provide such connections without the use of an interposer or additional structure, as required in many known applications. Additional advantages are discernible from the many other teachings herein.

The foregoing description of the preferred embodiments of this invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

Having thus described the invention, what is desired to be protected by Letters Patent is presented in the subsequently appended claims.

What is claimed is:

1. A method of forming a compressible contact structure on a semi-conductor chip, said method comprising:

providing a semi-conductor chip having at least one substantially planar surface including a plurality of individual contacts thereon;

bonding a compressible polymer layer to said at least one substantially planar surface including said plurality of individual contacts thereon to substantially cover said plurality of individual contacts, said polymer layer having an outer surface;

forming a plurality of openings within said compressible polymer layer, each of said openings extending through said compressible polymer layer from said outer surface to expose a corresponding one of said individual contacts;

depositing electrically conductive material within said plurality of openings to form electrical connections with said individual contacts and a plurality of electrically conductive line elements on said outer surface of said compressible polymer layer, each of said conductive line elements extending from a respective one of said openings a predetermined distance from said opening and including an end portion; and forming a plurality of contact members each on a respective one of said end portions of said conductive line elements, said compressible polymer layer allowing said plurality of contact members to deflect toward said substantially planar surface of said semi-conductor chip when said plurality of contact members are acted upon by an external force.

2. The method of claim 1 wherein said bonding of said compressible polymer layer to said at least one substantially planar surface of said semi-conductor chip comprises depositing an adhesive layer on said substantially planar surface and thereafter positioning said compressible polymer layer atop said adhesive layer.

3. The method of claim 1 wherein said forming of said plurality of openings within said compressible layer is accomplished using at least one of the group: laser ablation and photolithographic processing.

4. The method of claim 1 wherein said depositing of said electrically conductive material within said plurality of openings to form said electrical connections with said individual contacts and said plurality of electrically conductive line elements on said outer surface of said compressible polymer layer is accomplished using at least one of the group: sputter deposition, electroless plating, and electrolytic plating.

5. method of claim 1 wherein said forming of said plurality of contact members each on a respective one of said end portions of said conductive line elements is accomplished using at least one of the group: sputter deposition, electroless plating, and electrolytic plating.

6. The method of claim 1 further including aligning each of said contact members on said end portions of said conductive line elements with a respective contacting member on a circuitized substrate and thereafter pressing said semi-conductor chip and said circuitized substrate together to form a plurality of separable electrical connections between said contact members and said contacting members.

7. The method of claim 1 further including forming a solder element on each of said contact members on said end portions of said conductive line elements.

8. The method of claim 7 further including aligning said solder elements on said each of said contact members on said end portions of said conductive line elements with a respective contacting member on a circuitized substrate and thereafter heating said solder elements to form an electrical coupling between each of said contact members and said respective contacting members.

9. A semiconductor chip including at least one substantially planar surface having a plurality of individual contacts thereon and a compressible contact structure, said compressible contact structure comprising a compressible polymer layer bonded to said at least one substantially planar surface, said polymer layer having an outer surface, a plurality of openings within said compressible polymer layer, each of said openings extending through said compressible polymer layer from said outer surface to expose a corresponding one of said individual contacts, electrically conductive material within said plurality of openings in electrical connection with said individual contacts and a plurality of electrically conductive line elements on said outer surface of said compressible polymer layer, each of said conductive line elements extending from a respective one of said openings a predetermined distance from said opening and including an end portion, and a plurality of contact members each on a respective one of said end portions of said conductive line elements, said compressible polymer layer allowing said plurality of contact members to deflect toward said substantially planar surface of said semi-conductor chip when said plurality of contact members is acted upon by an external force.

10. The semi-conductor chip of claim 9 wherein said compressible polymer layer comprises polyester film material.

11. The semi-conductor chip of claim 9 wherein said electrically conductive material within said plurality of openings in electrical connection with said individual contacts of said semi-conductor chip comprises at least one of the group: copper and copper alloy.

12. The semi-conductor chip of claim 9 wherein said plurality of electrically conductive line elements on said outer surface of said compressible polymer layer comprise at least one of the group: copper and copper alloy.

13. The semi-conductor chip of claim 9 wherein said plurality of contact members each on a respective one of said end portions of said conductive line elements comprise at least one of the group: copper and copper alloy.

14. The semi-conductor chip of claim 9 further including a circuitized substrate having a plurality of contacting members on said circuitized substrate, each of said contact members adapted for engaging respective ones of said contacting members of said circuitized substrate to form separable electrical connections between said contact members and said contacting members when said semi-conductor chip and said circuitized substrate are pressed together, said semi-conductor chip and said circuitized substrate comprising an electronic package.

15. The semi-conductor chip of claim 9 further including a solder element on each of said contact members on said end portions of said conductive line elements.

16. The semi-conductor chip of claim 15 further including a circuitized substrate having a plurality of contacting members on said circuitized substrate, each of said solder elements forming an electrical coupling between each of said contact members and said respective contacting members.

17. The invention of claim 16 wherein said semi-conductor chip, said solder elements and said circuitized substrate comprise an electronic package.

* * * * *